United States Patent [19]
Belcher et al.

[11] Patent Number: 6,029,285
[45] Date of Patent: *Feb. 29, 2000

[54] ADAPTIVE COMPENSATION OF RF AMPLIFIER DISTORTION BY INJECTING PREDISTORTION SIGNAL DERIVED FROM RESPECTIVELY DIFFERENT FUNCTIONS OF INPUT SIGNAL AMPLITUDE

[75] Inventors: Donald K. Belcher; Michael A. Wohl; Kent E. Bagwell, all of Rogersville, Tenn.

[73] Assignee: Spectrian, Sunnyvale, Calif.

[ * ] Notice: This patent is subject to a terminal disclaimer.

[21] Appl. No.: 09/273,855

[22] Filed: Mar. 22, 1999

Related U.S. Application Data

[63] Continuation of application No. 08/626,239, Mar. 29, 1996, Pat. No. 5,892,397.

[51] Int. Cl.[7] .................................................. H04B 1/10
[52] U.S. Cl. ............................ 3/149; 330/136; 375/297; 455/63; 455/126
[58] Field of Search .............................. 330/136; 11/149; 375/297; 455/63, 126

Primary Examiner—Michael B. Shingleton
Attorney, Agent, or Firm—Charles E. Wands

[57] ABSTRACT

The envelope-dependency of the distortion-introducing behavior of an RF power amplifier is used to derive a predistortion signal, that is derived from a plurality of respectively different work function representative signals. Each work function signal, in turn, is based upon the envelope of the input signal to the RF power amplifier. Prior to being combined into a predistortion control signal, each work function signal is controllably weighted in accordance with an error measurement comparison of the amplifier input signal with the amplifier output signal. The error measurement function yields a measure of the error contained in the amplifier output signal, and drives a weight adjustment control mechanism, which controllably varies a set of weights for each of in-phase and quadrature components of the respectively different signal functions, in such a manner as to minimize the measured error.

11 Claims, 5 Drawing Sheets

ADAPTIVE COMPENSATION OF RF AMPLIFIER DISTORTION BY INJECTING PREDISTORTION SIGNAL DERIVED FROM RESPECTIVELY DIFFERENT FUNCTIONS OF INPUT SIGNAL AMPLITUDE

This is a continuation of application Ser. No. 08/626,239, filed Mar. 29, 1996 now U.S.Pat. No. 5,892,397.

FIELD OF THE INVENTION

The present invention relates in general to communication systems, and is particularly directed to an adaptive amplifier distortion compensation mechanism, that is operative to reduce amplitude and phase distortion of a microwave and RF power amplifier, by injecting a predistortion signal derived from respectively different work function signals, namely signals that are derived from the input envelope of the input signal to the RF amplifier.

BACKGROUND OF THE INVENTION

The need for increased capacity accompanying the expansion of the wireless communications market is forcing a move away from analog modulation techniques, such as frequency modulation (FM), to digital modulation formats, such as time division multiple access (TDMA) and code division multiple access (CDMA). Since both TDMA and CDMA modulation require greater linearity than can be routinely obtained in an uncorrected, high efficiency (class AB) RF power amplifier, it is necessary to incorporate some form of amplifier distortion correction mechanism into the signal flow path through the amplifier. In addition, market forces are demanding amplifiers to simultaneously handle a multitude of narrow-band signals, thus also increasing the need for linearity.

The distortion introduced by the amplifier causes the phase and amplitude of the output signal to depart from the respective phase and amplitude of the input signal, and may be considered as an incidental (and undesired) amplifier-sourced modulation of the input signal. Observation and analysis of this distortion-introducing behavior of an RF power amplifier by the inventors has led to the conclusion that the distortion is primarily driven by the envelope (instantaneous amplitude) of the input signal. For example, as the amplitude of the input signal varies, the shape of the amplifier output signal does not exactly track that of the input signal. Also, the harder the amplifier is driven (by the peak of the signal), the larger the phase delay through the amplifier.

SUMMARY OF THE INVENTION

In accordance with the present invention, this envelope-dependency of the distortion-introducing behavior of an RF power amplifier is used to derive a predistortion signal, that is applied to an input signal predistortion unit disposed in the path of the input signal to the amplifier. The predistortion unit may comprise a pair of gain and phase adjustment circuits, such as a fast variable attenuator and a fast phase shifter, respectively, coupled in cascade in the signal path to the input of the RF amplifier. As will be described, these gain and phase adjustment circuits are operative to predistort the phase and amplitude components of the input signal to the RF amplifier, in accordance with predistortion control signals that are derived from respectively different work functions of the instantaneous amplitude of the input signal to the RF power amplifier.

Each work function signal is controllably weighted in a weighting coefficient multiplier unit, by respective amplitude and phase component-associated weighting coefficients generated by a weighting coefficient generator, in accordance with an error measurement conducted on the amplifier output signal. The error measurement may be carried out in the time domain, as by way of a coherent receiver comparing the amplifier input and output signals, to derive respective amplitude and phase error signals.

The error measurement may alternatively be carried out in the frequency domain by a spectral measurement unit, which looks for the presence of energy in a prescribed portion of the frequency spectrum of the amplifier output signal, to determine whether the frequency spectrum of the output signal has departed from that of the frequency spectrum of the input signal. The amount of energy in a band pass filter employed by the spectral measurement is indicative of spectral distortion, rather than the desired signal, and is therefore representative of error. The error measurement is then coupled to the weighting coefficient generator, which is operative adjust the weighting coefficients, in such a manner as to minimize the measured error.

DETAILED DESCRIPTION

Figure 1:
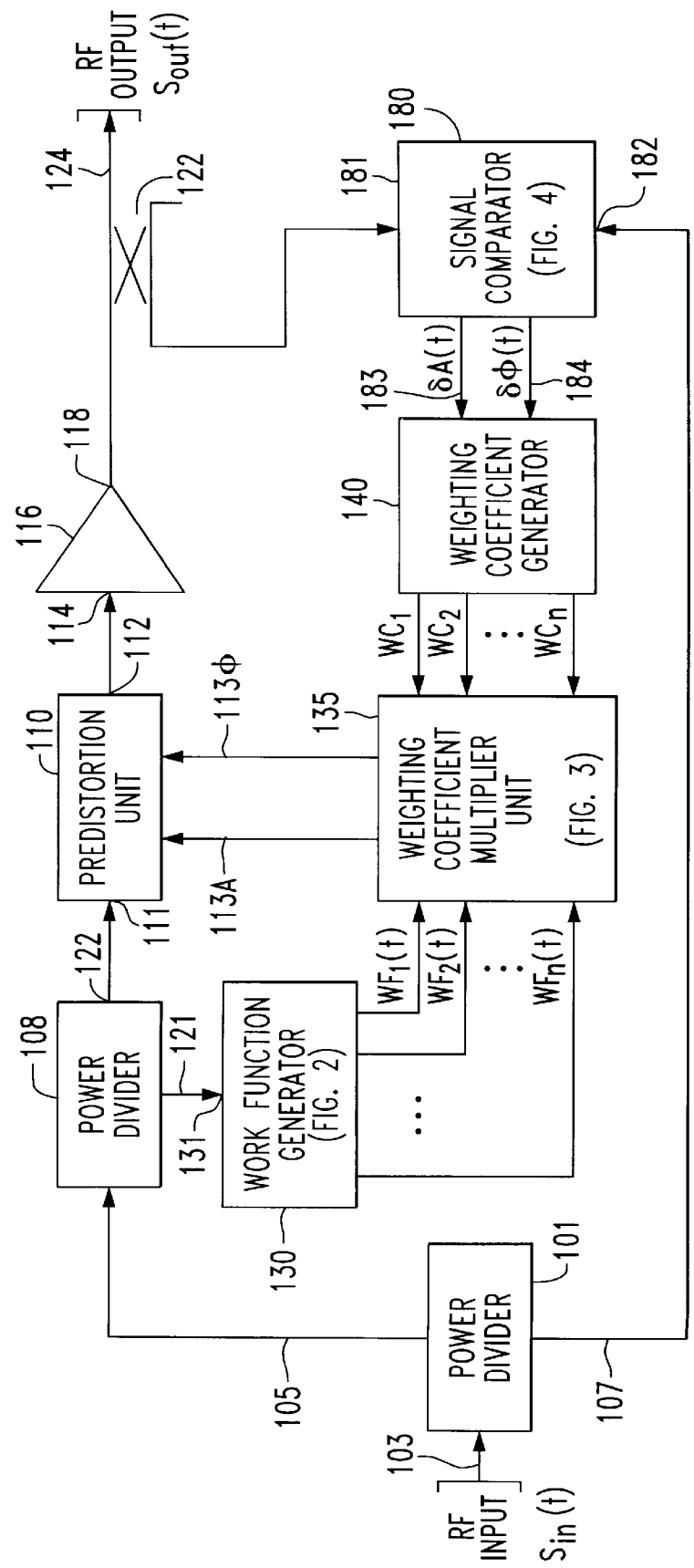
FIG. 1 diagrammatically illustrates an RF power amplifier circuit arrangement, which incorporates an adaptive distortion correction mechanism of a first embodiment of the present invention.

Before describing in detail the adaptive amplifier distortion compensation mechanism in accordance with the present invention, it should be observed that the present invention resides primarily in what is effectively a prescribed arrangement of conventional RF amplifier circuitry components, together with associated signal processing components (such as function generator circuits) and attendant supervisory control circuitry therefor, that controls the operations of such associated signal processing components. Consequently, the configuration of such circuitry and components, and the manner in which they are interfaced with other communication equipment have, for the most part, been illustrated in the drawings by a readily understandable block diagrams, which shows only those specific details that are pertinent to the present invention, so as not to obscure the disclosure with details which will be readily apparent to those skilled in the art having the benefit of the description herein. Thus, the block diagram illustrations are primarily intended to show the major components of the predistortion compensation arrangement in a convenient functional grouping, whereby the present invention may be more readily understood.

Referring now to FIG. 1, a non-limiting example of an RF power amplifier circuit arrangement, which incorporates the adaptive distortion correction mechanism of the present invention, is diagrammatically as comprising an input power divider 101, which splits or divides an input signal $S_{in}(t)$ that is applied to an input terminal 103 into two signal paths 105 and 107. The first or main signal path 105 through the RF amplifier 116 imparts an insertion delay of $\tau$ seconds to the input signal $S_{in}(t)$. The first signal path 105 includes a further power divider 108, a first output 121 of which is coupled to an input 131 of a work function generator unit 130. A second output 122 of the power divider 108 is coupled to an input 111 of an input signal predistortion unit 110. The output 112 of the input signal predistortion unit 110 is coupled to the input 114 of an RF power amplifier 116. The output 118 of the RF power amplifier 116, from which an output signal $S_{out}(t)$ is derived, is coupled through a directional coupler 122 to an RF output terminal 124. Directional coupler 122 supplies a portion of the output signal to a first input 181 of a signal comparator 180, to be described.

In a non-limiting embodiment, the input signal predistortion unit 110 may comprise a pair of gain and phase adjustment circuits, such as a fast variable attenuator and a fast phase shifter, coupled in cascade in the signal path 105 to the input of the RF amplifier. As will be described, these gain and phase adjustment circuits are operative to predistort the phase and amplitude components of the input signal $S_{in}(t)$ to the RF amplifier 116, in accordance with predistortion control signals that are derived from respectively different work functions of the instantaneous amplitude of the input signal to the RF power amplifier. These work function signals are adaptively adjusted (by processor control of the weighting coefficients WCi) to minimize the error as measured by the signal comparator 180, which error is representative of the distortion introduced by the RF amplifier.

The work function generator unit 130 is operative to generate a plurality of respectively different work function-representative signals $WF_1(t)$, $WF_2(t)$, . . . , $WF_n(t)$, each of which is a function of the instantaneous amplitude of the input signal $S_{in}(t)$ being amplified by the RF power amplifier 116. As noted earlier, from observation and analysis of the signal distortion introduced by an RF power amplifier, the inventors have concluded that the distortion is primarily dependent upon the instantaneous amplitude (envelope) of the input signal $S_{in}(t)$. As the instantaneous amplitude of the input signal varies, the shape of the amplifier output signal will depart from that of the input signal. Also, the harder the amplifier is driven, the larger will be the phase delay through the amplifier.

Figure 2:
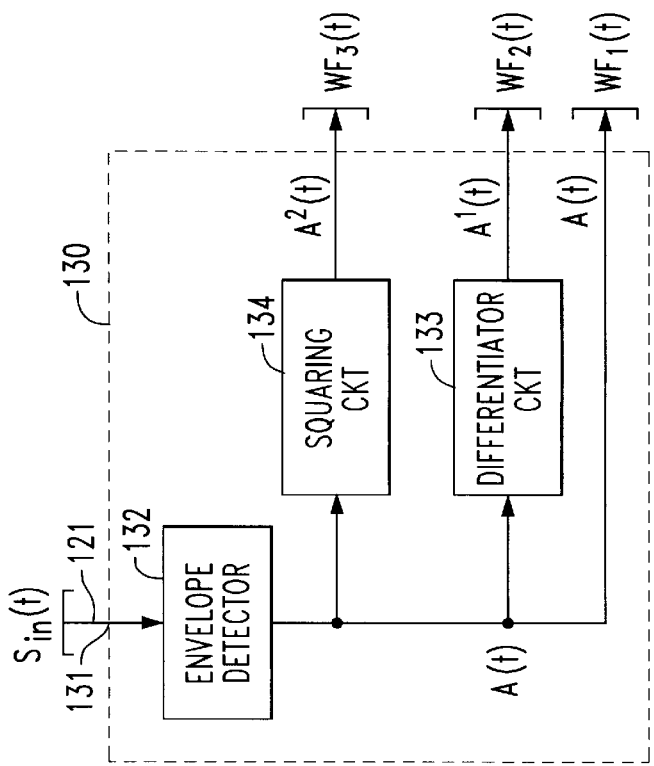
FIG. 2 diagrammatically illustrates examples of the types of instantaneous amplitude-based work functions that may be generated by the work function generator unit 130 of FIG. 1.

Non-limiting examples of the types of instantaneous amplitude-based work functions that may be generated by the work function generator unit are diagrammatically illustrated in the circuit diagram of FIG. 2, as including a first work function signal $WF_1(t)$ derived from an envelope detector 132 to which input 131 is coupled. The output of envelope detector 132 is directly proportional to the envelope or instantaneous amplitude A(t) of the input signal $S_{in}(t)$. A second work function signal $WF_2(t)$ that is proportional to the derivative of the instantaneous amplitude A'(t) of the input signal $S_{in}(t)$ is generated by a differentiator circuit 133, which is coupled to receive the output A(t) of envelope detector 132. A third work function signal $WF_3(t)$ that is directly proportional to the square of the instantaneous amplitude $A^2(t)$ of the input signal $S_{in}(t)$ is derived from a squaring circuit 134, which is also coupled to receive the output A(t) of envelope detector 132.

It should be observed that a respective work function signal $WF_i(t)$ generated by the work function generator unit 130 is not limited to the three types of signals described above and illustrated in FIG. 2, nor must the work function generator necessarily include such signals, in order to provide the adaptive distortion compensation of the present invention. Other types of signals may also be employed, such as a signal A"(t) proportional to the derivative of the derivative (double derivative) of the instantaneous amplitude A(t) of the input signal $S_{in}(t)$, a signal $A^3(t)$ proportional to the cube of the instantaneous amplitude A(t) of the input signal $S_{in}(t)$, and a signal (K-A(t)) proportional to a constant K minus the instantaneous amplitude A(t) of the input $S_{in}(t)$, as further non-limiting examples.

As further illustrated in FIG. 1, prior to being combined to form respective amplitude and phase predistortion control signals that are applied to the gain and phase adjustment circuits within the predistortion unit 110, each work function signal $WF_i(t)$ is controllably weighted or scaled in a weighting coefficient multiplier unit 135, which is operative to multiply each of the work function signals by respective amplitude and phase associated weighting coefficients $WC_{Ai}$ and $WC_{\phi i}$ generated by a weighting coefficient generator 140 in accordance with error measurement outputs produced by an error measuring signal comparator 180. The respective products (of the amplitude and phase associated weighting coefficients times the work function signals) are then summed into respective amplitude and phase predistortion control signals. These amplitude and phase distortion control signals are coupled over lines 113A and 113$\phi$ and applied to predistortion unit 110 so as to controllably modulate the amplitude and phase of the input signal $S_{in}(t)$ in a manner that introduces a complement of the distortion effect of the RF amplifier 116 on the input signal.

The signal processing mechanism through which work function signals are controllably weighted and combined to predistort the input signal is analogous to the technique employed in a transversal filter structure of an adaptive equalizer to reduce or cancel distortion introduced into a signal propagation path. In the present invention, however, rather than being derived from successive taps of a delay line, each work function signal $WF_i(t)$ is generated as a respectively different function F(A(t)) of the instantaneous amplitude/envelope A(t) of the input signal $S_{in}(t)$, as described above.

Figure 3:
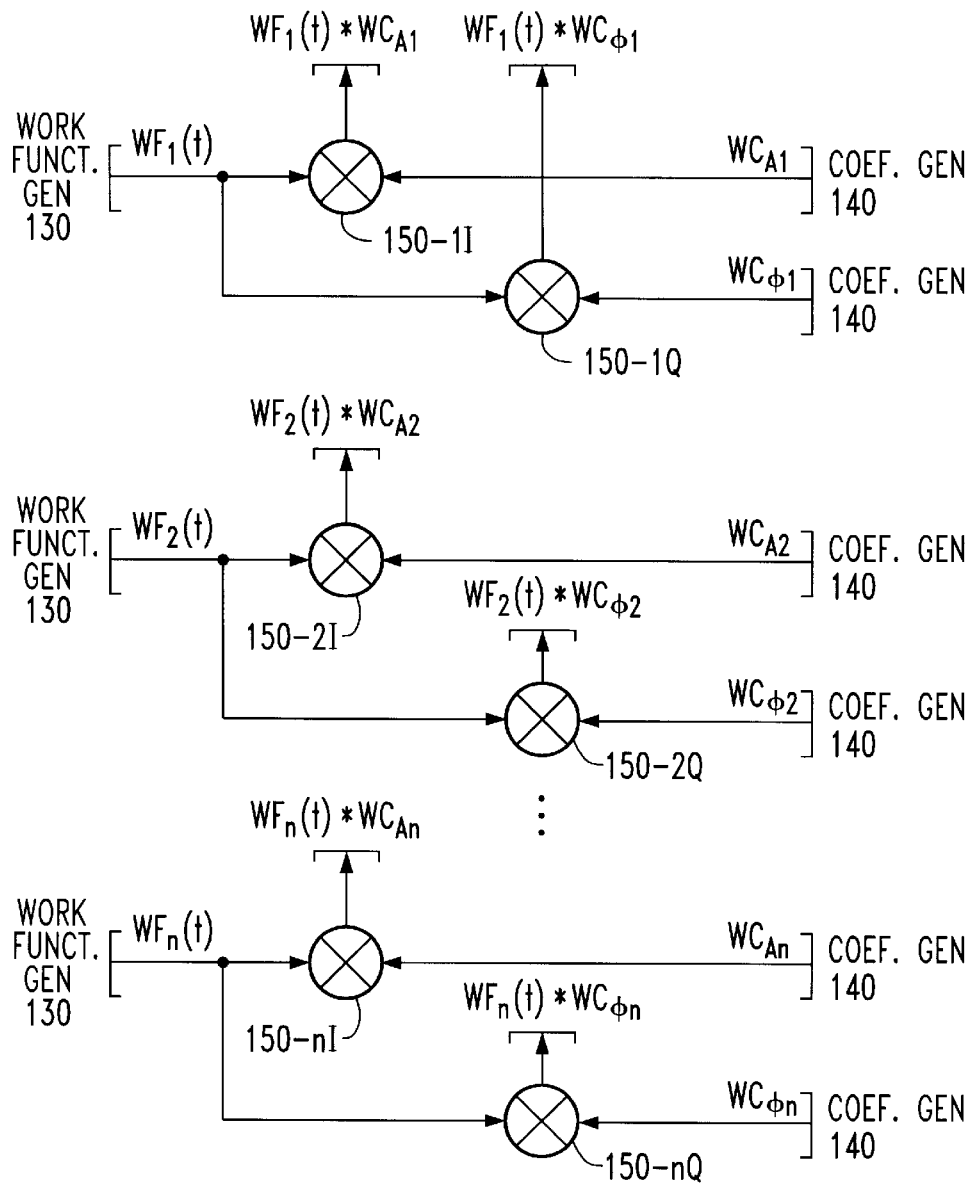
FIG. 3 diagrammatically illustrates the weighting coefficient multiplier unit 135 of FIG. 1.
Figure 3:
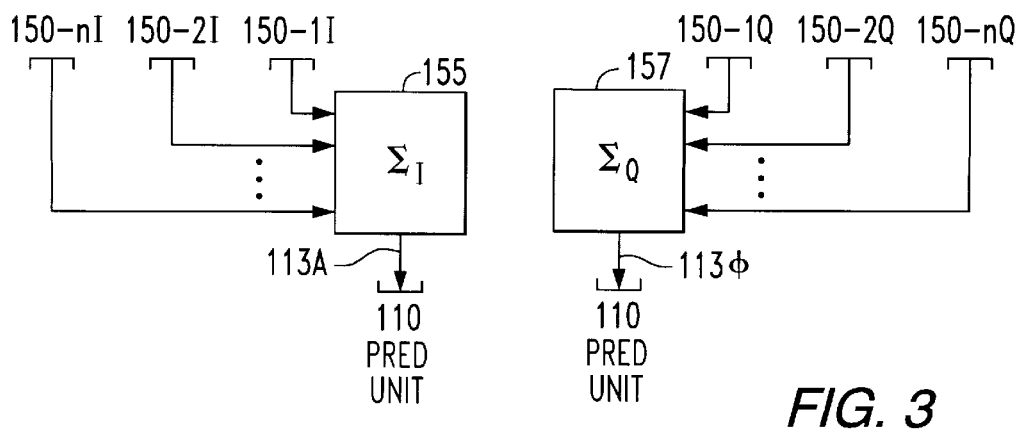

More particularly, as shown in FIG. 3, the respectively different work function-representative signals $WF_1(t)$, $WF_2(t)$, . . . , $WF_n(t)$, as generated by work function generator unit 130, are applied as first inputs of respective pairs of in-phase and quadrature weighting coefficient multipliers 150-1I/150-1Q, 150-2I/150-2Q, . . . , 150-nI/150-nQ. Each in-phase weighting coefficient multiplier 150-iI has a second input coupled to receive a respective amplitude weighting coefficient $WC_{Ai}$ from weighting coefficient generator 140; each quadrature-phase weighting coefficient multiplier 150-iQ has a second input coupled to receive a respective phase weighting coefficient $WC_{\phi i}$ from weighting coefficient generator 140. The outputs of multipliers 150 are therefore complex scaled or weighted versions of the respectively different work function representative signals $WF_1(t)$, $WF_2(t)$, . . . , $WF_n(t)$.

In addition to the multiplication operations carried out by the weighting coefficient multipliers 150, weighting coefficient multiplier unit 135 is operative to sum the respective in-phase (I) or amplitude (A) associated signal products, and the quadrature-phase (Q) or phase ($\phi$) associated signal product outputs, as shown at $\Sigma_I$ summing unit 155 and $\Sigma_Q$ summing unit 157. The composite (summed) amplitude signal produced by summing unit 155 is coupled over line 113A to the gain adjustment circuit within predistortion unit 110, so as to control the injection of a predistorting amplitude signal component into the input signal $S_{in}(t)$. Likewise, the composite (summed) phase signal produced by summing unit 157 is coupled over line 113φ to the phase adjustment circuit within predistortion unit 110, so as to control the injection of a predistorting phase signal component into the input signal $S_{in}(t)$.

The weighting coefficient generator 140 may comprise a digital signal processor, and associated analog-to-digital circuits (ADCs) which interface input ports of the processor with the signal comparator 180, and digital-to-analog conversion circuits (DACs), which interface the processor with the respective weighting coefficient multipliers 150 within weighting coefficient multiplier unit 135 of FIG. 3, described above. The processor employed by weighting coefficient generator 140 is programmed to execute a conventional error minimization algorithm, which is operative to perturb or iteratively update the magnitudes and polarities of respective ones of the recursively adjustable weighting coefficients WC1, WC2, . . . , WCn, so as to minimize the amplitude and phase difference signals $\delta A(t)$ and $\delta \phi(t)$ supplied thereto by signal comparator 180. Non-limiting examples of error minimization algorithms that may be executed for this purpose include a least mean squares (LMS) algorithm, a steepest decent (gradient-following) algorithm, a perturbation correlation algorithm, and various (random) numerical search methods, and the like, and equivalents thereof.

Figure 4:
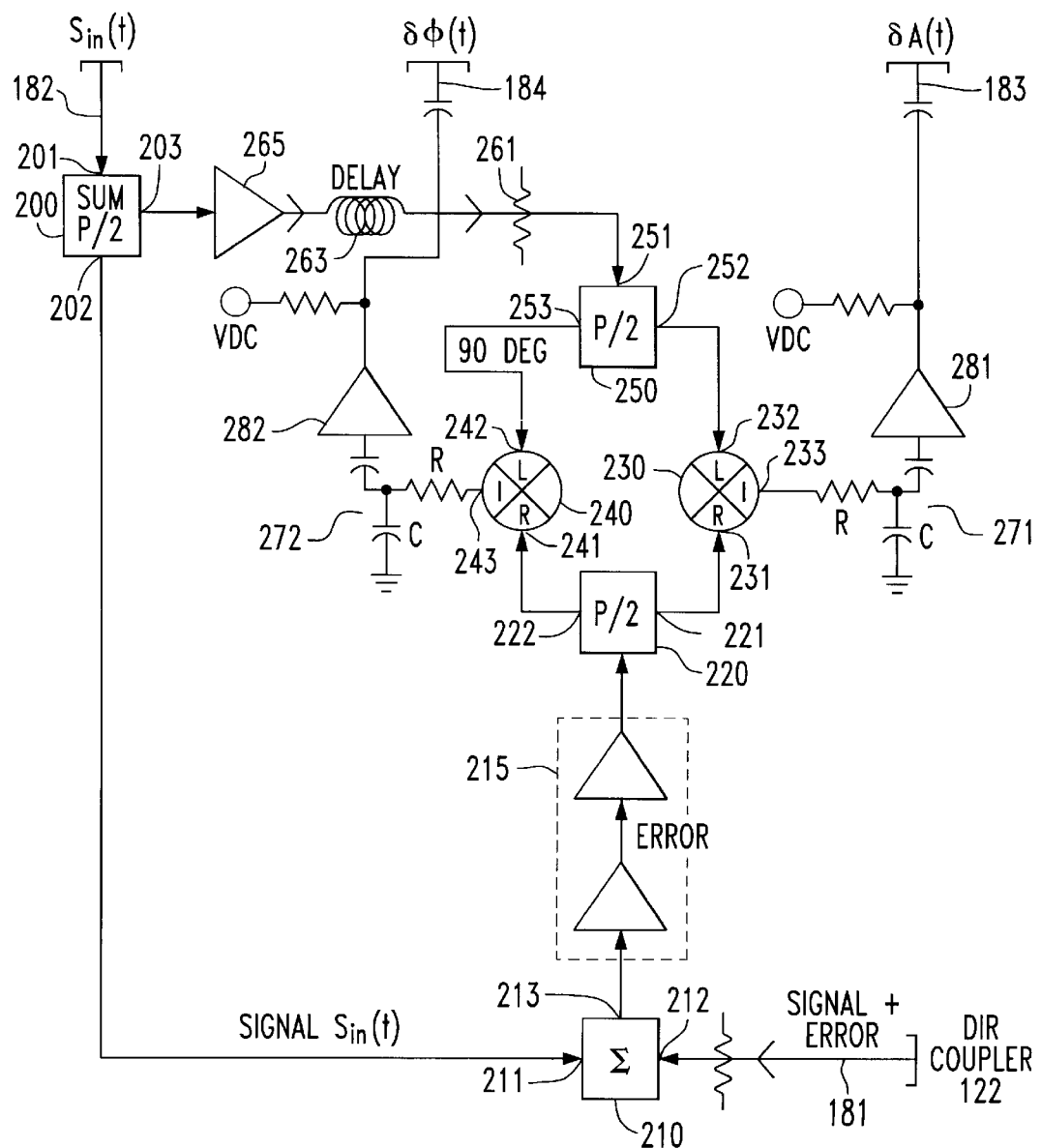
FIG. 4 schematically illustrates an implementation of a coherent receiver used to execute the functionality of the signal comparator 180 of FIG. 1.

In the present embodiment, measuring the error in the amplifier output signal $S_{out}(t)$ is effected by a signal comparator 180, which is a time domain device. One example of a time domain device is a coherent receiver, a non-limiting implementation of which is schematically illustrated in FIG. 4, to be described. The coherent receiver performs baseband processing of the delayed input signal $S_{in}(t)$ and the output signal $S_{out}(t)$, and generates amplitude and phase difference signal values $\delta A(t)$ and $\delta \phi(t)$, that are respectively representative of the differences in the amplitude and phase components of the signals applied to inputs 181 and 182. These amplitude and phase difference signal values $\delta A(t)$ and $\delta \phi(t)$ are coupled over respective output lines 183 and 184 to the weighting coefficient generator 140.

More particularly, as shown in FIG. 4, signal input 182, to which the input signal $S_{in}(t)$ is applied via delay line 119 from power divider 101, is coupled to an input 201 of a power divider 200, a first output 202 of which is coupled over line 204 to a first input 211 of a vector combiner 210. A second input 212 of vector combiner 210 is coupled to input 181 from the directional coupler 122, and receives therefrom the amplifier output signal plus any error introduced into the desired signal. Since the signal component of the input 181 to vector combiner 210 is ideally at the same amplitude but 180° out of phase with the signal at input 182, the output 213 of vector combiner 210 should contain only an error term.

The output 213 of vector combiner is coupled through amplifier circuitry 215 and applied to an input 221 of a power divider 220. Power divider 220 has a first output 222 thereof coupled to a first port 231 of a mixer 230. Power divider 220 has its second output 223 thereof coupled to a first port 241 of a mixer 240. A second input 232 to mixer 230 is derived from a first output 252 of a quadrature power divider 250, a second output 253 of which is 90° out of phase with the first input 252 and is coupled to a second input 242 of mixer 240. Quadrature power divider 250 may comprise a quadrature hybrid, or a power divider coupled with a 90° phase shifter/delay line, or equivalent thereof. Quadrature power divider 250 has an input 251 coupled through an attenuator 261 and a delay 263 to the output of an amplifier 265, the input of which is coupled to the second output 203 of power divider 200. The respective outputs 233 and 243 of mixers 230 and 240 are coupled through integrator circuits 271 and 272, and buffer circuits 281 and 282 to output lines 183 and 184.

Since the two inputs 231 and 232 of mixer 230 are effectively in-phase signal components, the multiplication of these two components in mixer 230 causes its output product (the undistorted signal times that part of the error component that is in-phase with the reference signal $S(t)$) to be representative of the amount of amplitude error. Conversely, since the two inputs 241 and 242 of mixer 240 are effectively 90° out of phase with one another, multiplication of these two components in mixer 240 causes its output product (a 90° delayed version of the undistorted signal times that part of the error component that is out of phase with the reference signal $S(t)$, namely a phase error component) to be representative of the amount of phase error.

Figure 6:
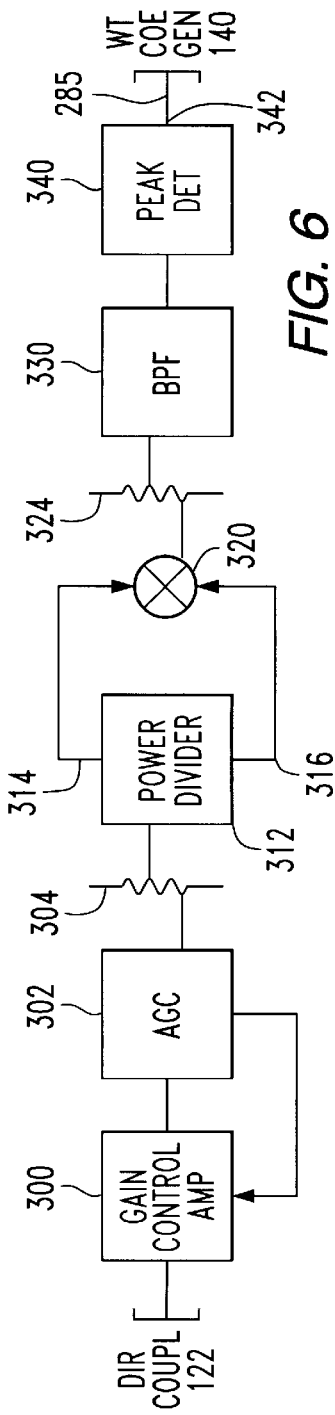
FIG. 6 is a detailed illustration of the spectral measurement unit 280 of FIG. 5.
Figure 5:
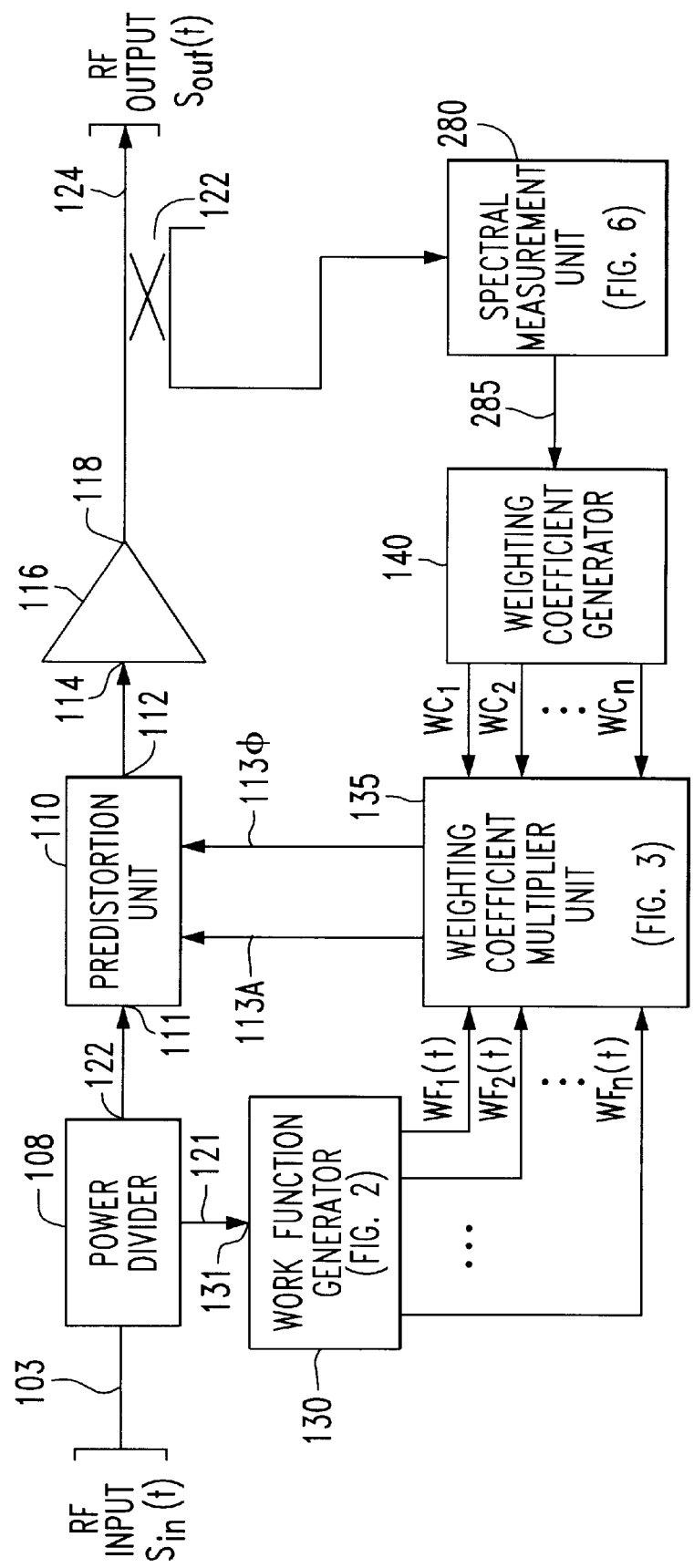
FIG. 5 diagrammatically illustrates an RF power amplifier circuit arrangement, which incorporates an adaptive distortion correction mechanism of a second embodiment of the present invention.

In an alternative embodiment of the invention, shown diagrammatically in FIGS. 5 and 6, measuring the error in the amplifier output signal $S_{out}(t)$ is effected by a frequency domain device. In the diagrammatic illustration shown in FIG. 5, the error measurement is carried out by a spectral measurement unit 280, shown in detail in FIG. 6, to be described, which looks for the presence of energy in a prescribed portion of the frequency spectrum of the amplifier output signal to determine whether the frequency spectrum of the output signal has departed from that of the frequency spectrum of the input signal. The amount of energy in a low frequency (baseband) filter within the spectral measurement mechanism corresponds to the spectral distortion at the offset frequency, rather than the desired signal. This unwanted energy measurement is coupled over line 285 to the weighting coefficient generator 140. In response to this energy value, the weighting coefficients generated by weighting coefficient generator 140 and supplied to the weighting coefficient multiplier unit 135 are adjusted to minimize the spectral regrowth component in the output of RF amplifier 116.

As shown in FIG. 6, a spectral measurement unit 280 comprises a gain control amplifier circuit 300, which is coupled to the directional coupler 122 at the output of the RF amplifier. The output of gain control amplifier 300 is coupled with an automatic gain control AGC circuit 302, which is operative to maintain the gain through amplifier 300 so as to prevent peaks in the signal being processed from saturating the operation of a downstream squaring circuit 320. The output of AGC circuit 302 is coupled through a power level setting pad 304, the output of which is coupled to a power divider 312. The two outputs 314 and 316 of power divider 312 are coupled to inputs of a squaring circuit implemented as mixer (multiplier) 320, the output of which is coupled through a power level setting pad 324 and applied to a band pass filter 330. The pass band of filter 330 is set to pass frequencies in an unwanted spectral regrowth band (undesired signal energy). Energy passed by the band pass filter 330 is coupled to a peak detector circuit 340, the output 342 of which is coupled to the weighting coefficient generator 140. This peak value (representative of unwanted energy in the RF amplifier output signal) is coupled over line 285 to the weighting coefficient generator 140. Since energy passed by band pass filter is associated with unwanted signal, it is representative of error in the amplifier output. Weighting coefficient generator 140 executes an error minimization algorithm, such as one of the error minimization algorithms referenced previously, to adjust the weighting coefficients supplied to the weighting coefficient multiplier unit 135, so as to minimize the spectral regrowth component and thereby minimize error in the output of the RF amplifier.

As will be appreciated from the foregoing description, the adaptive input signal predistortion mechanism of the present invention, by monitoring both the envelope-dependency of the distortion-introducing behavior of the amplifier and the amplifier output, is able to generate, and iteratively adjust, work function-based predistortion signals, through which the phase and amplitude components of the input signal to the RF amplifier are controllably distorted, so as to minimize the error in the amplifier output and thereby effectively compensate for the inherent distortion behavior of the amplifier.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein, but intend to cover all such changes and modifications as are obvious to one of ordinary skill in the art.

We claim:

1. A method for correcting for distortion in an RF power amplifier comprising the steps of:

(a) generating a plurality of respectively different signal functions of an input signal applied to said RF power amplifier;

(b) controllably adjusting said plurality of respectively different signal functions in accordance with error content in an output signal derived from said RF power amplifier; and (c) modifying said input signal in accordance with said plurality of respectively different signal functions as controllably adjusted in step (b).

2. A method according to claim 1, wherein step (a) comprises monitoring the instantaneous amplitude of said input signal and generating a plurality of respectively different signal functions of the instantaneous amplitude of said input signal.

3. A method according to claim 2, wherein step (b) includes:

(b1) comparing said input signal with said output signal to derive a measure of said error content of said output signal, (b2) generating a plurality of weights in accordance with an error minimization mechanism that is operative to reduce said error content, and (b3) adjusting said plurality of respectively different signal functions in accordance with said weights.

4. A method according to claim 3, wherein step (b1) comprises applying said input signal and said output signal to a coherent receiver to derive a measure of said error contained in said output signal, step (b2) comprises processing the output of said coherent receiver using an error minimization mechanism to generate said plurality of weights.

5. A signal processing arrangement for reducing distortion components introduced into an output signal produced by an RF amplifier comprising:

a work function signal generator which is operative to generate a plurality of respectively different work function signals of an input signal applied to said RF amplifier;

a work function signal adjustment unit which is operative to controllably adjust said plurality of respectively different work function signals generated by said work function signal generator in accordance with error in said output signal; and an input signal predistortion unit which is operative to modify said input signal in accordance with said plurality of respectively different work function signals as controllably adjusted by the work function signal adjustment unit.

6. A signal processing arrangement according to claim 5, wherein said work function signal generator is operative to generate said plurality of respectively different work function signals in accordance with the instantaneous amplitude of said input signal.

7. A signal processing arrangement according to claim 5, wherein said input signal predistortion unit is operative to adjust amplitude and phase of said input signal in accordance with said plurality of work function signals as controllably adjusted by said work function signal adjustment unit.

8. A signal processing arrangement according to claim 5, wherein said a work function signal adjustment unit includes an error measurement unit that measures amplitude error and phase error in said output signal based upon a comparison of said input signal with said output signal, and wherein said work function signal adjustment unit is operative to generate a plurality of weights in accordance with the amplitude error and phase error measured by said error measurement unit, and controllably adjusts said plurality of respectively different work function signals in accordance with said weights.

9. A signal processing arrangement according to claim 8, wherein said error measurement unit comprises a coherent receiver.

10. A signal processing arrangement according to claim 7, wherein said error measurement unit is operative to measure energy in a prescribed spectral portion of said output signal, so as to derive a frequency domain measure of said error.

11. A signal processing arrangement according to claim 10, wherein said error measurement unit includes a bandpass filter having a frequency passband that is exclusive of a desired frequency content of said output signal, and is operative to measure energy contained in said pass band indicative of error in said output signal.

* * * * *